(12) United States Patent
Park et al.

(10) Patent No.: US 6,936,922 B1
(45) Date of Patent: Aug. 30, 2005

(54) SEMICONDUCTOR PACKAGE STRUCTURE REDUCING WARPAGE AND MANUFACTURING METHOD THEREOF

(75) Inventors: Sung Soon Park, Seoul (KR); Sang Jae Jang, Seoul (KR); Choon Heung Lee, Gyeonggi-do (KR); Seon Goo Lee, Seoul (KR); Eun Sook Sohn, Seoul (KR); Sung Su Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 41 days.

(21) Appl. No.: 10/672,886

(22) Filed: Sep. 26, 2003

(51) Int. Cl.[7] .............................................. H01L 23/48
(52) U.S. Cl. ..................... 257/737; 257/738; 257/780; 438/613
(58) Field of Search ............................... 257/737, 738, 257/687, 688, 779, 778, 781, 780; 438/612, 438/613, 108

(56) References Cited

U.S. PATENT DOCUMENTS

| | | | |
|---|---|---|---|
| 5,474,958 A | 12/1995 | Djennas et al. | |
| 5,602,059 A | 2/1997 | Horiuchi et al. | |
| 5,620,928 A | 4/1997 | Lee et al. | |
| 5,668,405 A | 9/1997 | Yamashita | |
| 5,763,939 A | 6/1998 | Yamashita | |
| 5,777,387 A | 7/1998 | Yamashita et al. | |
| 5,786,239 A | 7/1998 | Ohsawa et al. | |
| 5,885,849 A | 3/1999 | DiStefano et al. | |
| 5,903,052 A | 5/1999 | Chen et al. | |
| 5,909,633 A | 6/1999 | Haji et al. | |
| 6,060,778 A | 5/2000 | Jeong et al. | |
| 6,093,970 A | 7/2000 | Ohsawa et al. | |
| 6,172,419 B1 | 1/2001 | Kinsman | |
| 6,180,881 B1 | 1/2001 | Isaak | |
| 6,198,171 B1 | 3/2001 | Huang et al. | |
| 6,225,146 B1 | 5/2001 | Yamaguchi et al. | |
| 6,242,281 B1 | 6/2001 | Mclellan et al. | |
| 6,268,568 B1 | 7/2001 | Kim | |
| 6,395,578 B1 | 5/2002 | Shin et al. | |
| 6,399,418 B1 | 6/2002 | Glenn et al. | |
| 6,448,506 B1 | 9/2002 | Glenn et al. | |
| 6,452,278 B1 | 9/2002 | DiCaprio et al. | |
| 6,486,537 B1 | 11/2002 | Liebhard | |
| 6,501,184 B1 | 12/2002 | Shin et al. | |
| 6,515,356 B1 | 2/2003 | Shin et al. | |

(Continued)

Primary Examiner—Tuan H. Nguyen
(74) Attorney, Agent, or Firm—Gunnison, McKay & Hodgson, L.L.P.; Serge J. Hodgson

(57) ABSTRACT

An electrical substrate useful for semiconductor packages is disclosed. The electrical substrate includes a core insulative layer. A first surface of the insulative layer has circuit patterns thereon. Some of the circuit patterns are stepped in their heights from the first surface, in that a first subportion of the circuit pattern, including a ball land, extends further from the first surface than a second subportion of the same circuit pattern, and also extends further from the first surface than a ball land of other circuit patterns. Accordingly, solder balls fused to the ball lands of the stepped circuit patterns extend further from the first surface than same-size solder balls fused to the ball lands of the non-stepped circuit patterns, thereby circumventing electrical connectivity problems that may arise from warpage of the electrical substrate.

20 Claims, 13 Drawing Sheets

U.S. PATENT DOCUMENTS

| | | |
|---|---|---|
| 6,541,854 B2 | 4/2003 | Huang et al. |
| 6,564,454 B1 | 5/2003 | Glenn et al. |
| 6,682,998 B2 * | 1/2004 | Kinsman .................... 438/613 |
| 6,746,894 B2 * | 6/2004 | Fee et al. .................... 438/106 |
| 2002/0140065 A1 * | 10/2002 | Paek .......................... 257/673 |
| 2002/0180040 A1 * | 12/2002 | Camenforte et al. ........ 257/738 |

* cited by examiner

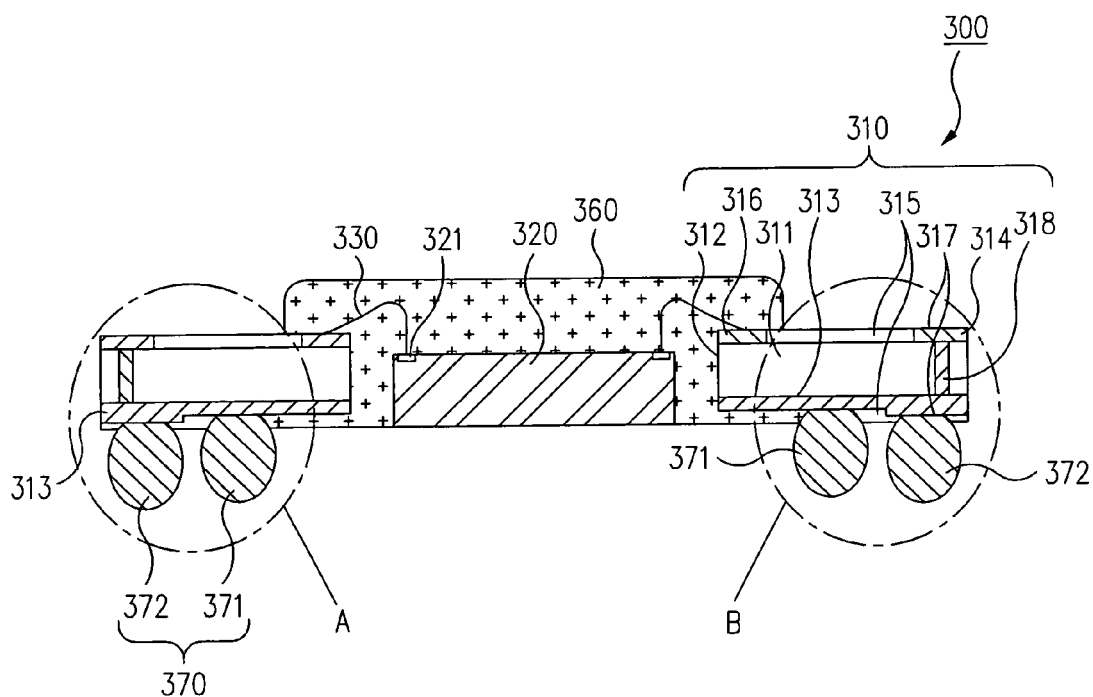
FIG. 3
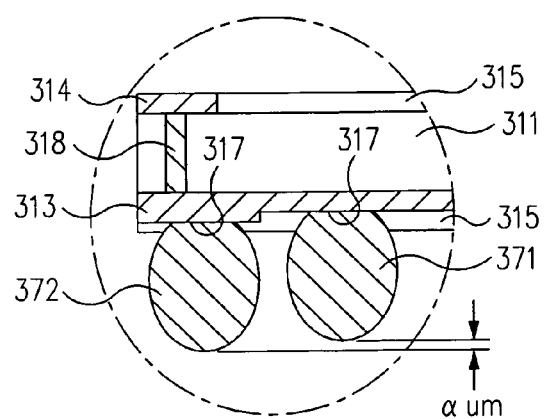 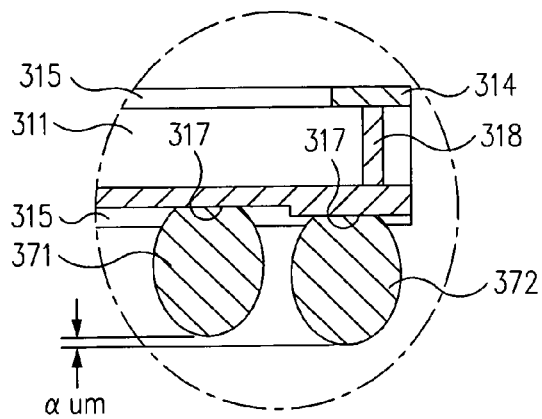
FIG. 3A                FIG. 3B

SEMICONDUCTOR PACKAGE STRUCTURE REDUCING WARPAGE AND MANUFACTURING METHOD THEREOF

BACKGROUND OF THE INVENTION

1. Field of the Invention

The present invention relates to semiconductor packaging.

2. Description of the Related Art

A popular, thin chip size package (CSP) for housing a semiconductor die includes a thin substrate with an insulative core layer overlaid by metal circuit patterns and an outermost protective layer. The core layer has a central through hole, i.e., an aperture entirely through the substrate. The semiconductor die is electrically coupled to the circuit patterns by bond wires. The semiconductor die is disposed in the through hole, and is supported in the through hole by a hardened encapsulant. The encapsulant fills the through hole around the semiconductor die, and covers the active surface and peripheral sides of the semiconductor die, the bond wires, and a portion of a first side of the substrate around the through hole. An inactive surface of the semiconductor die is exposed in a common plane with a second side of the substrate and a planar portion of the encapsulant. After the encapsulation process, a plurality of same-size (within a manufacturing tolerance) solder balls are fused to the circuit patterns of one of the sides of the substrate. The user of the package electrically couples the package to an external printed circuit board by positioning the package so that the solder balls are each juxtaposed with a metal trace of the printed circuit board, and then reflowing the solder balls so that the solder balls are fused to the metal traces of the printed circuit board.

During the encapsulation process, a heated resin encapsulant, such as epoxy molding compound (EMC), is injected into the through hole and onto the semiconductor die. The resin encapsulant hardens while cooling to room temperature. However, because the semiconductor die, the EMC, and the substrate have different thermal properties, e.g., experience different amounts of expansion or contraction with temperature, and because the substrate is so thin, the encapsulated semiconductor package is prone to warpage due to the relative over-contraction of the EMC. This post-encapsulation warpage phenomenon increases exponentially as the area of the substrate increases, which acts as a limit on the size of the semiconductor die that can be housed in the package. Further, when the warpage is present, the solder balls do not all have their bottom surfaces at the same level, i.e., in a common plane, as is intended. Solder balls in an outermost row of solder balls near a perimeter of the substrate are most likely to be affected, e.g., to have their bottom surfaces in a plane above the plane formed by the bottom surfaces of the remainder of the solder balls. Accordingly, the affected solder balls do not fuse to, or form a poor quality fuse with, the juxtaposed metal traces of the external printed circuit board during the reflowing process, resulting in an electric connection failure or an increased likelihood of an electric connection failure. Obviously, semiconductor package manufacturers must help the package user to avoid such problems.

BRIEF SUMMARY OF THE INVENTION

The present invention includes semiconductor packages that, among other things, avoid, mitigate, and/or counteract the above-mentioned problem of post-encapsulation warpage.

For instance, one embodiment of a semiconductor package within the present invention includes one or more members or slugs, called reinforcements herein, that are adhered to an active surface of the semiconductor die and are disposed entirely within the bond pads of the active surface. The reinforcement may be a monolithic structure formed of a semiconductor material, or a metal. The presence of the reinforcement reduces an amount of encapsulant needed to encapsulate the semiconductor die, e.g., by displacing an equivalent volume of encapsulant that otherwise would be required to fill a through hole of the semiconductor package and cover the semiconductor die. The reduction in the amount of encapsulant used reduces or avoids post encapsulation warpage of the substrate of the semiconductor package.

Another embodiment of the present invention includes an electrical substrate having stepped circuit patterns. A example use for the electrical substrate is in a semiconductor package. The electrical substrate includes an insulative core layer having opposed first and second surfaces. Circuit patterns are provided on at least the first surface of the insulative core layer. Some of the circuit patterns have subportions, e.g., ball lands, to which solder balls are ultimately fused, that have differing thicknesses (i.e., heights) relative to the first surface than other subportions of the same circuit pattern and the ball land portion of other circuit patterns on the first surface. Accordingly, the solder balls of the semiconductor package, which are the same size, will project different distances from the first surface, because the ball lands underlying the solder balls have different thicknesses. For instance, the ball land subportion of a circuit pattern that supports a solder ball disposed near the perimeter of the substrate may be tens of microns thicker than the ball land subportion of a different circuit pattern that supports a solder ball disposed further inward from the perimeter of the substrate. This configuration circumvents the post-encapsulation warpage problem mentioned above, because the further projection of the solder balls near the perimeter of the substrate may allow those near-to-the-perimeter solder balls to make a good electrical connection to an external printed circuit board, even where the post-encapsulation warpage is present.

These and other aspects of the present invention may be best understood by reference to the following detailed description of the exemplary embodiments, when read in conjunction with the accompanying drawings thereof.

BRIEF DESCRIPTION OF THE DRAWINGS

FIG. 3 is a cross sectional view of a semiconductor package having a stepped circuit pattern according to an alternative embodiment of the present invention;

FIGS. 3A and 3B are partially enlarged views of circled portions A and B of FIG. 3;

Common reference numerals are used throughout the drawings and detailed description to indicate similar elements. Redundant discussion thereof is typically omitted.

DETAILED DESCRIPTION

Figure 1:
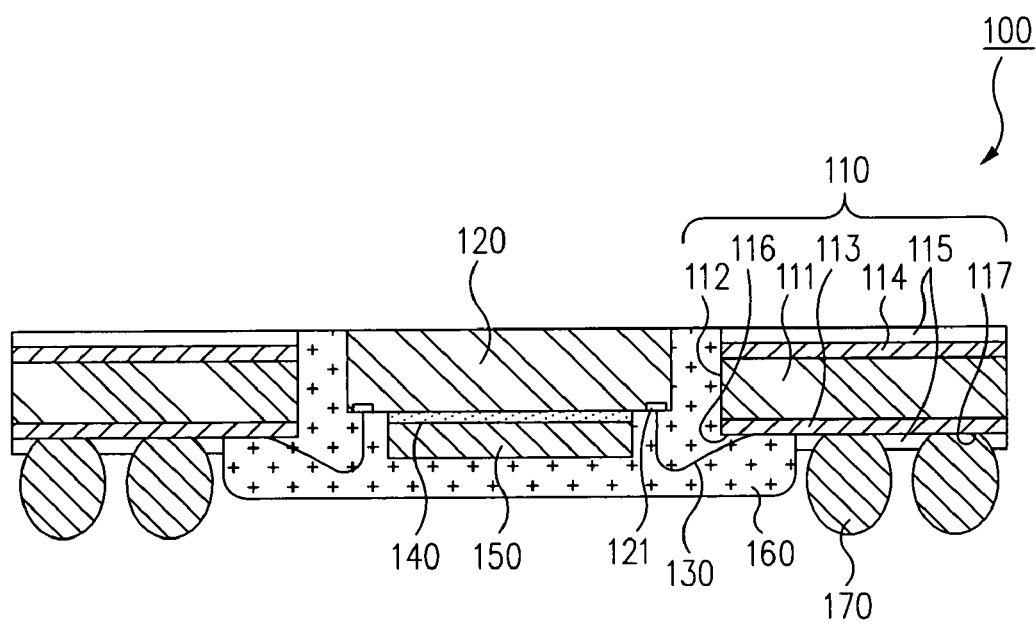
FIG. 1 is a cross sectional view of a semiconductor package having one reinforcement according to an embodiment of the present invention.

In accordance with one embodiment of the present invention, a semiconductor package 100 having a reinforcement 150, is illustrated in a cross sectional view in FIG. 1. The semiconductor package 100 includes a rectangular substrate 110 having a rectangular through hole 112 at a center thereof. A semiconductor die 120 is mounted in the through hole 112. A plurality of conductive wires 130 provide electrical connection between bond pads 121 on the active surface of the semiconductor die 120 and the substrate 110. A reinforcement adhesive layer 140 is applied to the active surface of the semiconductor die 120 within the bond pads 121. A single, plate-like reinforcement 150 is fixedly supported on the reinforcement adhesive layer 140. Finally, an encapsulant 160 fills the through hole 112, and covers the semiconductor die 120, the conductive wires 130, the reinforcement adhesive layer 140, the reinforcement 150, and an inner subportion of the lower surface of substrate 110 around through hole 112.

The substrate 110 includes a central, rectangular insulative thermosetting core resin layer 111 through which through hole 112 is formed. Through hole 112 has a large enough area to allow the insertion of semiconductor die 120 therein. A plurality of electrically conductive circuit patterns 113 are formed on a lower surface of the core resin layer 111.

A blanket conductive surface 114 is formed on the entire upper surface of resin layer 111, and may be used to provide protection from electromagnetic waves. If desired, one or more electrically conductive vias (not shown) may electrically couple the conductive surface 114 through resin layer 111 to one or more circuit patterns 113, so that conductive surface 114 may be electrically coupled to a solder ball 170 of the package.

Both the circuit patterns 113 and the conductive surface 114 are made from metals, such as aluminum (Al), Copper (Cu), or tungsten (W), which may be plated with gold, silver, or other plating metals.

Exposed portions of the upper and lower surfaces of resin layer 111, the conductive surface 114, and the circuit patterns 113 may be coated with a protective layer 115, except over bond fingers 116 and ball lands 117. The protective layer 115 serves to protect the substrate 110 from the external environment. The protective layer 115 may be an epoxy-based resin material.

The semiconductor die 120 is mounted in the through hole 112 of the substrate 110. The semiconductor die 120 has an active surface with a plurality of bond pads 121 thereon, which are used to input/output signals, and an opposite inactive (i.e., backside) surface. The X-Y area of through hole 112 is greater that the X-Y area of the active and inactive surfaces of semiconductor die 120 so that the semiconductor die 120 fits entirely within through hole 112.

The thickness of the semiconductor die 120 may be less than that of the substrate 120, as shown, to provide for a thinner package.

The bond pads 121 of semiconductor die 120 are each electrically connected with respective ones of the bond fingers 116 of circuit patterns 113 of substrate 110 by respective conductive wires 130. The conductive wires 130 are typically formed of copper (Cu), gold (Au), or equivalent conductors.

In alternative embodiments, a plurality semiconductor dies 120, e.g., stacked semiconductor dies 120 or laterally adjacent semiconductor dies 120, each with a reinforcement 150 thereon, may be provided in through hole 112 and may be electrically coupled to each other and/or to the bond fingers 116.

One side of the reinforcement adhesive layer 140 is in contact with and adhered to the active surface of the semiconductor die 120 within the area defined by bond pads 121. The reinforcement adhesive layer 140 is applied carefully without covering the bond pads 121, which are generally formed in rows along the peripheral edges of the active surface of the semiconductor die 120. Because the semiconductor die 120 and the reinforcement 150 are encapsulated later by the encapsulant 160, reinforcement adhesive layer 140 is made from a material having enough adhesive force enough to at least temporarily affix the reinforcement 150. To this end, epoxy or its equivalent is generally used.

The reinforcement 150 is affixed to the active surface of semiconductor die 120 by reinforcement adhesive layer 140. The reinforcement 150 may be a monolithic rectangular prism structure that has thermal properties, e.g., shrinkage, similar to that of the semiconductor die 120. To this end, the reinforcement 150 may be a slug of a typical semiconductor material, such as silicon(Si), germanium(Ge), or gallium-arsenide (GaAs), that does not include integrated circuits (e.g., a dummy die) and so on, or a slug of a metal, such as Cu, Al and so on.

The reinforcement 150 has a rectangular perimeter, and an X-Y area less than the X-Y area of the active surface of semiconductor die 120. Reinforcement 150 is sized and placed on the active surface of semiconductor die 120 so as to be entirely within a region defined by the bond pads 121. The reinforcement 150 does not cover the bond pads 121. In the example of FIG. 1, the single reinforcement 150 occupies a substantial portion, e.g., 50–85% of the area of the active surface of semiconductor die 120.

A vertical thickness of the reinforcement 150 is selected based on consideration, for example, of a thickness of the semiconductor die 120, a height of each bonding wire 130, a height of the solder balls 170, and a desired thickness of encapsulant 160.

The encapsulant 160 fills through hole 112, and supports semiconductor die 120 in through hole 112. A planar upper surface of encapsulant 160 is in a common horizontal plane with an exposed inactive backside surface of semiconductor die 120 and an upper surface of substrate 110. A lower surface of substrate 110 around through hole 112, including the bond fingers 116 of circuit patterns 113, is covered by encapsulant 160. Encapsulant 160 also covers the active and side surfaces of semiconductor die 120, the conductive wires 130, the reinforcement adhesive layer 140, and the reinforcement 150. The encapsulant 160 may be an epoxy mold compound (EMC) that is formed in a mold cavity under conditions of heat and pressure, and then is hardened. Alternatively, encapsulant 160 may be a liquid encapsulant material that is hardened.

The presence of the reinforcement 150 on the active surface of semiconductor die 120 reduces the volume of encapsulant 160 necessary to fill through hole 112 and cover semiconductor die 120, in comparison to the volume of encapsulant 160 that would be required if reinforcement 150 were not included in semiconductor package 100. By reducing the relative amount of encapsulant 160 used in the semiconductor package 100, the amount of post-encapsulation warpage of the substrate 110 is reduced.

In determining a thickness for reinforcement 100, it may be useful to have an allowance of between 4 and 5 mils between the active surface of the semiconductor die 120 and the top exterior surface of the cap of encapsulant 160, to allow for proper encapsulant flow during molding. In an alternative embodiment, where plural semiconductor die are stacked one on top of the other in through hole 112, with the reinforcement 150 attached to the active surface of the top semiconductor die, it may be desirable to have a greater allowance, e.g., 7 to 8 mil, up to 10 mil, between the active surface of the lower semiconductor die and the top exterior surface of the cap of encapsulant 160. In such stacked embodiments, where stacked same-size die are supported in the through hole 112, the active surface of the lower semiconductor die may be attached to the inactive surface of the upper semiconductor die using a spacer, which may be a silicon slug with adhesive on its opposed surfaces, or a double-sided adhesive film. The spacer has a height sufficient to space the top die over the bond wires of the lower die. Such a spacer is not necessary in embodiments where the lower die is smaller that the upper die, such that the upper die fits within the bond pads of the lower die.

A plurality of same-size solder balls 170 are fused onto the ball lands 117 of the circuit patterns 113. As shown, the active surface of semiconductor die 120, the bond pads 121 on the active surface, the circuit patterns 113, and the solder balls 170 are all oriented in a same, downward direction. The solder balls 170 function to transmit electrical signals to connection terminals of external equipment, e.g., metal traces of an external printed circuit board. Each solder ball makes use of an alloy of tin and lead. However, the material of the solder balls 170 is not limited to such an alloy. The solder balls may be formed of other conductive metals, such as Au, Cu and so forth.

Figure 2:
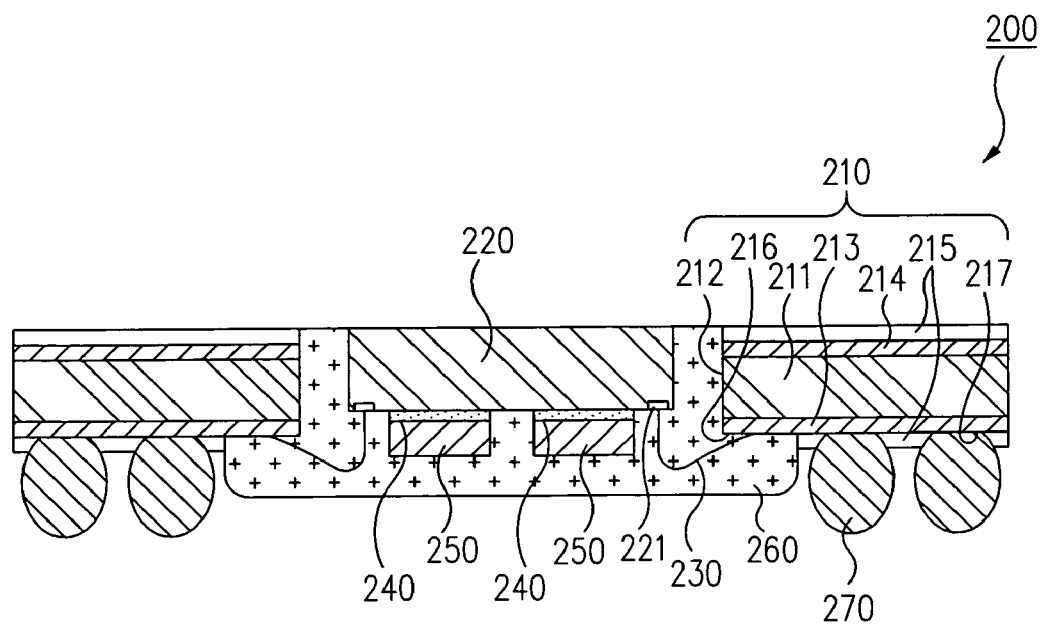
FIG. 2 is a cross sectional view of a semiconductor package having a plurality of reinforcements according to an alternative embodiment of the present invention.

FIG. 2 illustrates an alternative semiconductor package in accordance with the present invention. Semiconductor package 200 has a construction similar to that of the semiconductor package 100 of FIG. 1. Similar features have the same reference numbers used in FIG. 1, plus 100. Only differences between the semiconductor packages 100 and 200 will be described, to avoid redundancy.

As shown in FIG. 2, semiconductor package 200 includes a plurality of rectangular, plate-like reinforcements 250. In particular, two relatively-smaller size reinforcements 250 are affixed to the active surface of the semiconductor die 220 of semiconductor package 200, whereas in semiconductor package 100, there is only one relatively-larger reinforcement 150 affixed to the active surface of semiconductor die 100. The two reinforcements 250 are the same size and shape (rectangular prisms) in this embodiment, and are formed of the same monolithic material. The materials and functions of reinforcements 250 are the same as those discussed above for reinforcement 150. The two reinforcements 250 are each bonded to the active surface of the semiconductor die 220 by a respective one of two reinforcement adhesive layers 240, which are applied to the active surface of the semiconductor die 220 entirely within the bond pads 121 and are spaced apart from each other. The reinforcement adhesive layers 240 do not cover bond pads 121.

The two reinforcements 250 each and together have a rectangular X-Y area less than the X-Y area of the active surface semiconductor die 220, so that both of the reinforcements 250 may together be placed entirely within the bond pads 221 of semiconductor die 220, without covering any of the bond pads 221. For example, each reinforcement 250 may have an area that is 20% to 40% of the area of the active surface of semiconductor die 220, so that in sum the two reinforcements 250 occupy 40% to 80% of the area of the active surface of semiconductor die 220.

The two reinforcements 250 extend parallel to one another on the active surface of semiconductor die 220, spaced apart at a constant interval. Here, to reduce a volume of encapsulating material, the gap between the reinforcements 250 is formed as narrow as possible.

Use of the FIG. 2 embodiment, with two reinforcements 250, may facilitate the flow of the molten encapsulant 160 when a center gate molding method is used to encapsulate the semiconductor die 120. The center gate is positioned over the gap between the two reinforcements 250.

An alternative to the embodiments of FIGS. 1 and 2 is to apply the reinforcement adhesive layer(s)s 140, 240 to the inactive surface of the semiconductor die 120, 220, and to affix the reinforcement(s) 150, 250 to the inactive surface of the semiconductor die 120, 220 rather than to the active surface of the semiconductor die 120, 220.

FIG. 3 illustrates another semiconductor package in accordance with the present invention. The semiconductor package 300 of FIG. 3 has a construction similar to that of the semiconductor package 100 of FIG. 1. Similar features have the same reference numbers used in FIG. 1, plus 200. Only differences between the semiconductor packages 100 and 300 will be described, to avoid redundancy.

Differences between semiconductor package 300 and semiconductor package 100 include that, in semiconductor package 300, the active surface and bond pads 321 of semiconductor die 320 are oriented in an upward direction, opposite the orientation of the solder balls 370, whereas in semiconductor package 100, the active surface and bond pads 121 of semiconductor die 120 are oriented in a same, downward direction as the solder balls 170.

To accommodate the different orientation of semiconductor die 320, the conductive layer on the upper surface of resin layer 311 of substrate 310 is patterned into a layer of circuit patterns 314, which include bond fingers 316 and, optionally, ball lands 317. Ball lands 317 may be provided as part of the upper circuit patterns 314 for use in applications where another semiconductor package may be stacked on and electrically coupled to the semiconductor package 300. The ball lands 317 of the upper circuit patterns 314 may be omitted in other applications.

Electrically conductive vias 318 extending vertically through the resin layer 311 electrically couple the circuit patterns 314 of the upper surface of resin layer 311 to the circuit patterns 313 on the lower surface of resin layer 311. The circuit patterns 313 include ball lands 317 to which the solder balls 370 are fused. Here, both the lower circuit patterns 313 and the upper circuit patterns 314 are made from Cu, Au, Al or their equivalent. A protective layer 315 for protecting the substrate 310 from an external environment is provided on both the upper and lower surfaces of resin layer 311, but does not cover the bond fingers 316 and ball lands 317 of circuit patterns 313 and 314.

The encapsulant 360 of semiconductor package 300 fills through hole 312, and supports semiconductor die 320 in through hole 312. A planar lower surface of encapsulant 360 is in a common horizontal plane with an exposed inactive backside surface of semiconductor die 320 and the lower surface of substrate 310. A central portion of the upper surface of substrate 310 around through hole 312, including the bond fingers 316 of circuit patterns 314, is covered by encapsulant 360. Encapsulant 360 also covers the active and side surfaces of semiconductor die 320, and the conductive wires 330.

Another difference between semiconductor packages 300 and 100 is that, in semiconductor package 300, some of the circuit patterns 313 on the lower surface of resin layer 311 of substrate 310 are stepped, such that at least the ball lands 317 of the circuit patterns 313 that are located relatively-closer to the perimeter of the substrate 310 are thicker than the ball lands 317 of the circuit patterns 313 that are located relatively-closer to through hole 313. In other words, the ball lands 317 that are closer to the outer perimeter of substrate 310 protrude to a greater height from the lower surface of resin layer 311 than the ball lands 317 that are relatively closer to the through hole 312 of substrate 310. As a result, the solder balls 370, which are all the same size, of semiconductor package 300, do not all have their lower free surfaces in a common horizontal plane, as is the case in semiconductor package 100 of FIG. 1. Instead, the solder balls 370 at the outer perimeter of the package extend further from the lower surface of resin layer 311 than the solder balls 370 that are closer to the through hole 312, because of the differing thicknesses of their respective underlying ball lands 317.

In particular, the solder balls 370 of semiconductor package 300 are composed of inner rows of solder balls 371 and outer rows of solder balls 372, with the inner row solder balls 371 being relatively-closer to through hole 312 and the outer row solder balls 372 being relatively-closer to the outer perimeter of substrate 310. With reference to FIGS. 3A and 3B, note that the outer solder balls 372 (and the ball lands 317 under them) extend further from the lower surface of resin layer 311 than the inner solder balls 371 (and the ball lands 317 under them). Accordingly, the lower free end of the outer solder balls 372 is in a lower horizontal plane relative to resin layer 311 than the lower free end of inner solder balls 371 by a distance of $\alpha$. The distance $\alpha$, which may be, for example, 15 to 20 $\mu$m, is calculated to circumvent an expectable amount of warpage of the substrate 310, so that good electrical connections are made between the solder balls 372 and an external printed circuit board even in the presence of the post-encapsulation warpage.

The stepped profile (i.e., thickness difference) amongst the circuit patterns 313 may be obtained by applying additional, or thicker, plating layers over the outer ends of the circuit patterns 313 that support the outer rows of solder balls 372 verses the circuit patterns 313 that support the inner row of solder balls 371. The additional plating may be applied only over the ball lands 317 of the selected circuit patterns 313, or over the ball land 317 and an adjacent portion of the circuit pattern 313.

In alternative embodiments, where there are additional rows of solder balls beyond the two rows of solder balls 371, 372 of semiconductor package 300, the circuit patterns 313 may be provided with a plurality of steps in a direction extending outwardly from through hole 312 to the outer perimeter of substrate 310, with one step for each successive row of solder balls. For instance, in an embodiment where there are three rows of solder balls, including an inner row, an outer row, and an intermediate row between the inner and outer rows, the intermediate row of solder balls (and the underlying ball lands 317) may protrude a single step distance $\alpha$ further from the lower surface of resin layer 311 than the inner row of solder balls (and underlying ball lands 317), and the outer row of solder balls (and underlying ball lands 317) may extend a two step distance $2\alpha$ further from the lower surface of resin layer 311 than the inner row of solder balls (and underlying ball lands 317).

On the other hand, even if there are more than two rows of solder balls, it may only be necessary, depending on the expectable amount of warpage of the substrate 310, to provide a step in the circuit patterns that support the outer row of solder balls, as in FIG. 3, and not to provide steps in the circuit patterns that support the plurality of rows of solder balls inward of the outer row. Such would be appropriate where, for instance, a significant connection problem would only be expected for the outer row of solder balls. In another embodiment, where warpage may be expected to be worse at a corner of the substrate, only the outer row ball lands 317 and solder balls at the corners of the substrate are stepped, while other outer row solder balls and inner row solder balls and ball lands are not stepped.

Figure 4A:
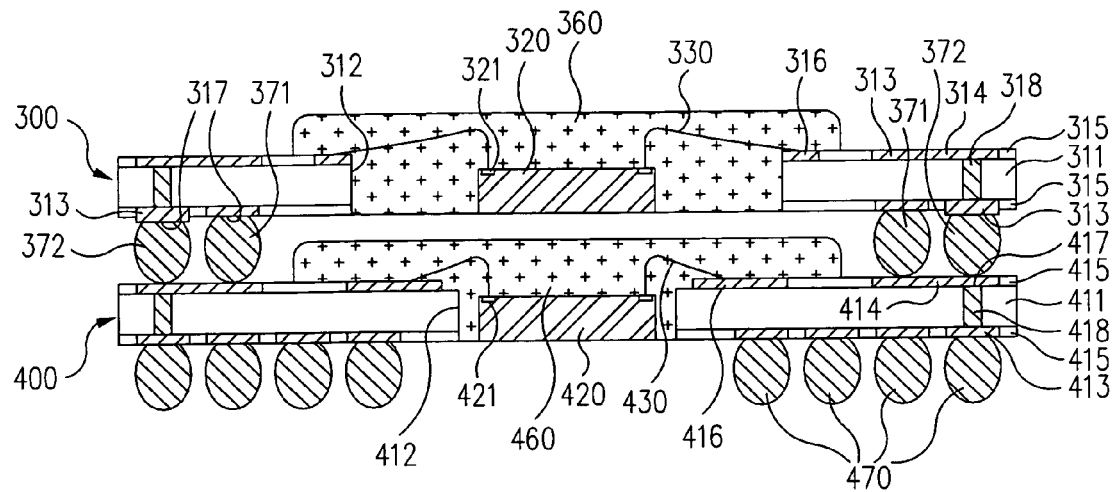
FIG. 4A is a cross sectional view showing a stacked structure of a conventional lower semiconductor package and an upper semiconductor package with a stepped circuit pattern.
Figure 4B:
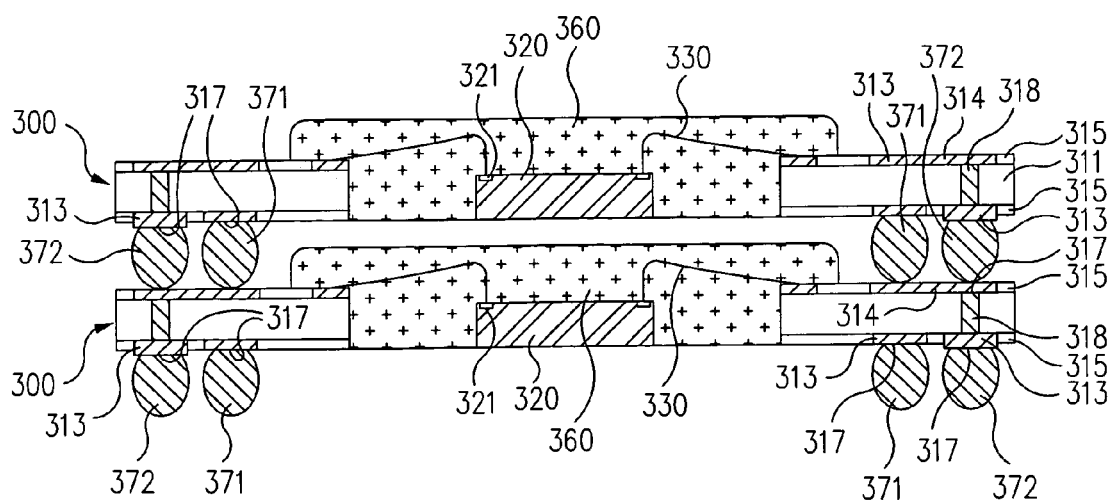
FIG. 4B is a cross sectional view of a stacked structure in which both the lower and upper semiconductor packages have a stepped circuit pattern.

An application for semiconductor package 300 is in a stack of semiconductor packages, as illustrated in FIGS. 4A and 4B. In FIG. 4A, a semiconductor package 300 is stacked on, and electrically coupled to, a conventional semiconductor package 400, which in turn may be electrically coupled to a printed circuit board.

Semiconductor package 400 has a construction similar to that of the semiconductor package 300 of FIG. 3. Similar features have the same reference numbers used in FIG. 3, plus 100. Only pertinent differences between the semiconductor packages 300 and 400 will be described, to avoid redundancy.

One difference between semiconductor package 400 and semiconductor package 300 is that semiconductor package 400 includes four rows of solder balls 470, rather than two rows of solder balls 371, 372 as in semiconductor package 300. The free ends of the solder balls 470 of semiconductor package 400 are all in a common horizontal plane. The lower circuit patterns 413 of semiconductor package 400 are not stepped like the lower circuit patterns 313 of semiconductor package 300.

Note that, in semiconductor package 400, the circuit patterns 414 on the upper surface of resin layer 411 include ball lands 417 as well as bond fingers 416. Accordingly, to provide a stack of semiconductor packages, the solder balls 371, 372 of an upper semiconductor package 300, may be fused to the upper ball lands 417 of the lower semiconductor package 400 in order to electrically couple the semiconductor packages 300 and 400. With such a configuration, the semiconductor dies 320, 420 of the stacked packages may electrically communicate with each other, and/or may each be electrically accessed through the solder balls 470, circuit patterns 413 and 414, and vias 418 of the lower semiconductor package 400.

The stepped circuit patterns 313 and solder balls 371, 372 of semiconductor package 300 allow a good electrical connection to be made between the solder balls 371, 372 of semiconductor package 300 and the ball lands 417 of the upper circuit patterns 414 of semiconductor package 400, even where there is post-encapsulation warpage of the substrate 310 of semiconductor package 300.

In one application, semiconductor package 400 may be used to house a logic device semiconductor die 420, which would tend to have a relatively large number of bond pads 421. Such a package, with a relatively large number of solder balls 470, will tend to have a smaller area through hole 412 relative to the area of through hole 312 of semiconductor package 300, and hence should be less susceptible to post-encapsulation warpage. Semiconductor package 300 may be used to house a memory device semiconductor die 320, which would tend to have a relatively fewer number of bond pads 321 and solder balls 371, 372, and a relatively larger area through hole 312. The larger area through hole 312 compared to the area of through hole 412 makes post-encapsulation warpage of semiconductor package 300 more likely than warpage of semiconductor package 400.

FIG. 4B illustrates an alternative stack of semiconductor packages. In FIG. 4B, two stackable semiconductor packages 300, each with the stepped lower circuit patterns 313 and solder balls 371, 372, are stacked one on top of the other and electrically coupled together. In particular, the stepped solder balls 371, 372 of the upper semiconductor package 300 are fused to the ball lands 317 of the upper circuit patterns 314 of the lower semiconductor package 300. One application for such a stack is where the semiconductor dies 320 are memory devices. The stepped circuit patterns 313 and solder balls 371, 372 circumvent an expectable warpage of substrate 310, allowing good electrical connections to be formed by the solder balls.

An alternative stackable semiconductor package along the lines of semiconductor package 300 includes upper circuit patterns 314 that are stepped like the lower circuit patterns 313 of semiconductor package 300, so that the outer ball lands 317 of the upper circuit patterns 314 protrude further from the upper surface of resin layer 300 than the inner ball lands 317 of the upper circuit patterns 314. Such a package could circumvent post-encapsulation warpage of a non-stepped conventional semiconductor package stacked on top of the stepped-circuit-pattern stackable semiconductor package, so that solder balls of the upper package may be successfully fused to the relatively-thicker ball lands 317 of the stepped upper circuit patterns 314.

Practitioners will appreciate that the stepped circuit patterns 313 and solder balls 371, 372 of semiconductor package 300 may be used with any insulative-substrate-based semiconductor package or assembly where warpage is a potential issue, and not only with encapsulated semiconductor packages including a central through hole.

Practitioners also will appreciate that the reinforcements 150 or 250 of FIGS. 1 and 2, respectively, may be used in semiconductor package 300, thereby obtaining the benefits of the various anti-warpage features of the present invention in a single semiconductor package.

FIGS. 5A to 5I illustrate an exemplary method of manufacturing the semiconductor package 100 of FIG. 1.

Figure 5A:
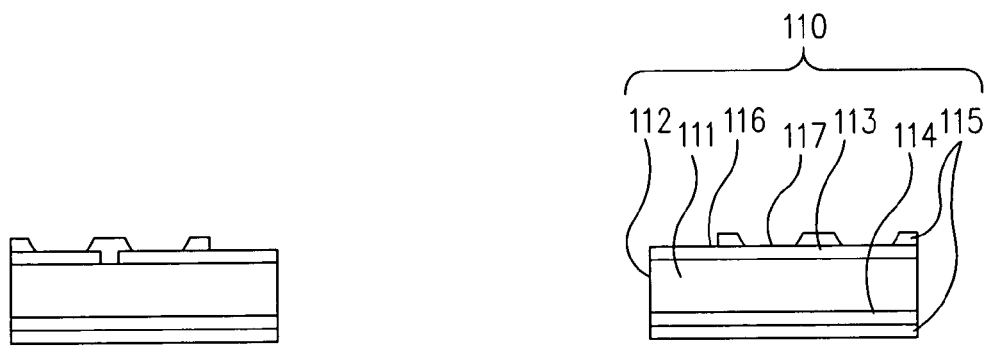
FIGS. 5A to 5I are cross sectional views illustrating procedures of a method for manufacturing the semiconductor package of FIG. 1.

As shown in FIG. 5A, a substrate 110 is provided, which includes a resin layer 111 with a through hole 112, circuit patterns 113 on one surface of the resin layer 111, and a blanket conductive layer 114 on an opposite surface thereof. A protective layer 115 overlies exposed regions of the resin layer 111, the conductive layer 114, and the circuit patterns 113, except over the bond fingers 116 and plurality of ball lands 117. If desired, a thin layer of gold, silver, nickel, or the like may be plated onto the top surface of the bond fingers 116 and the ball lands 117 to facilitate attachment of the bond wires 130 and solder balls 170, respectively, thereto.

Practitioners will appreciate that, while a single substrate 110 is shown in FIG. 5A, that the substrate 110 may be one unit of an array of interconnected substrates 110 that ultimately will be singulated after the encapsulation and solder ball attachment steps described below.

Figure 5B:
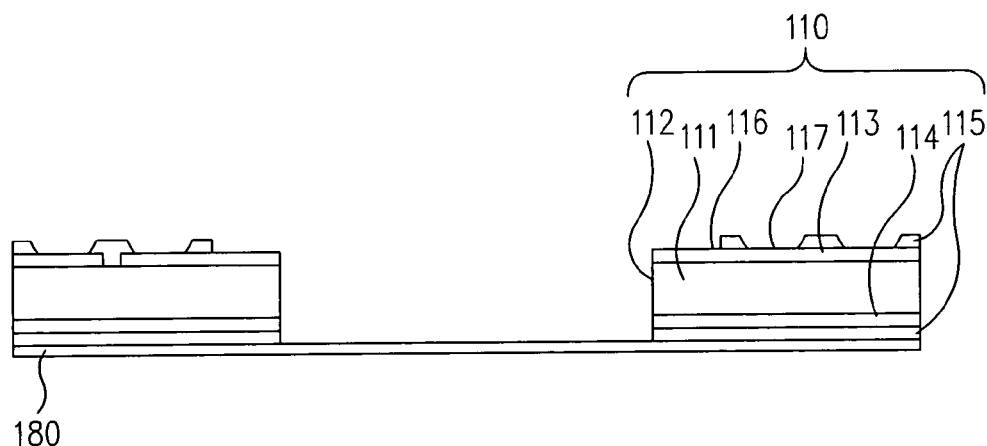

As shown in FIG. 5B, a coverlay tape 180 is adhered over the lower surface of the substrate 110, which in this orientation, includes the conductive layer 114. Most importantly, the coverlay tape 180 spans through hole 112.

Figure 5C:
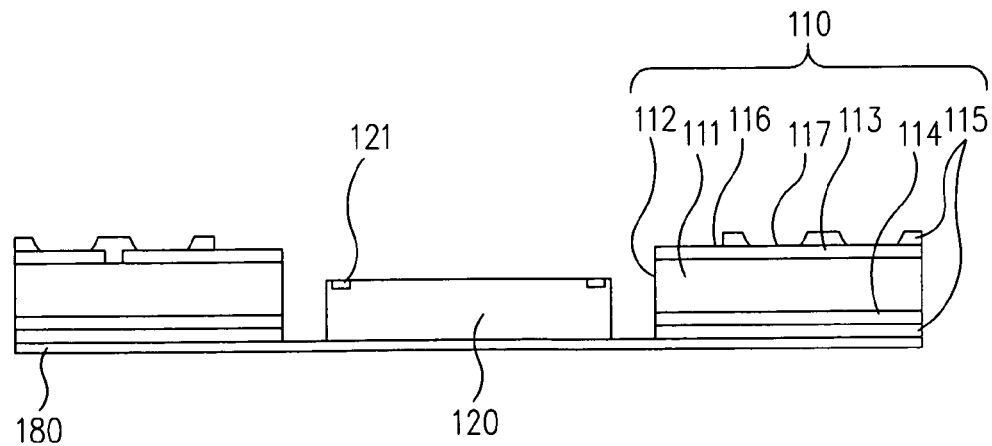

As shown in FIG. 5C, the semiconductor die 120 is placed within the through hole 112 and adhered to coverlay tape 180. Typically, the coverlay tape 180 will have sufficient adhesiveness to hold semiconductor die 120 in place until after the encapsulation process.

Figure 5D:
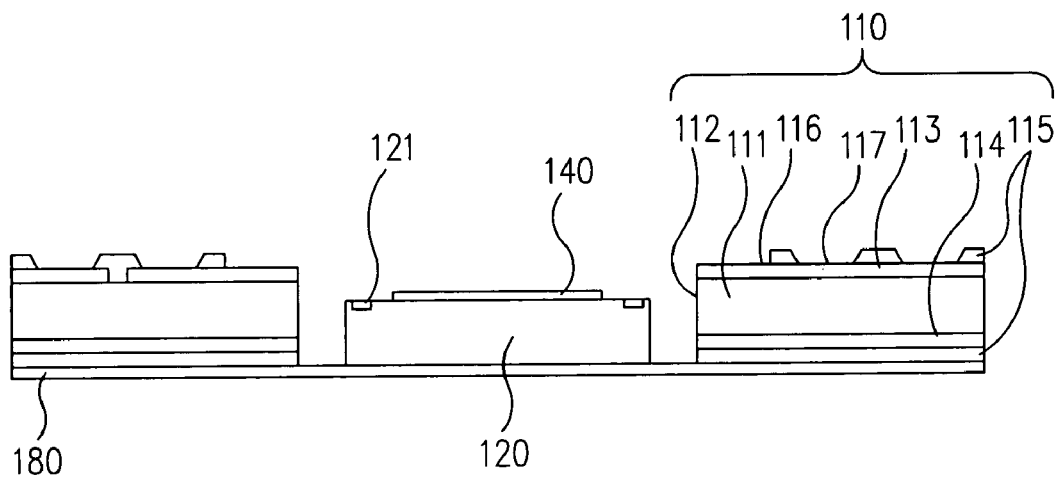

As shown in FIG. 5D, the reinforcement adhesive layer 140 is applied on the upper, active surface of the semiconductor die 120 entirely within an area bounded by bond pads 121. Bond pads 121 are not covered by reinforcement adhesive layer 140.

Figure 5E:
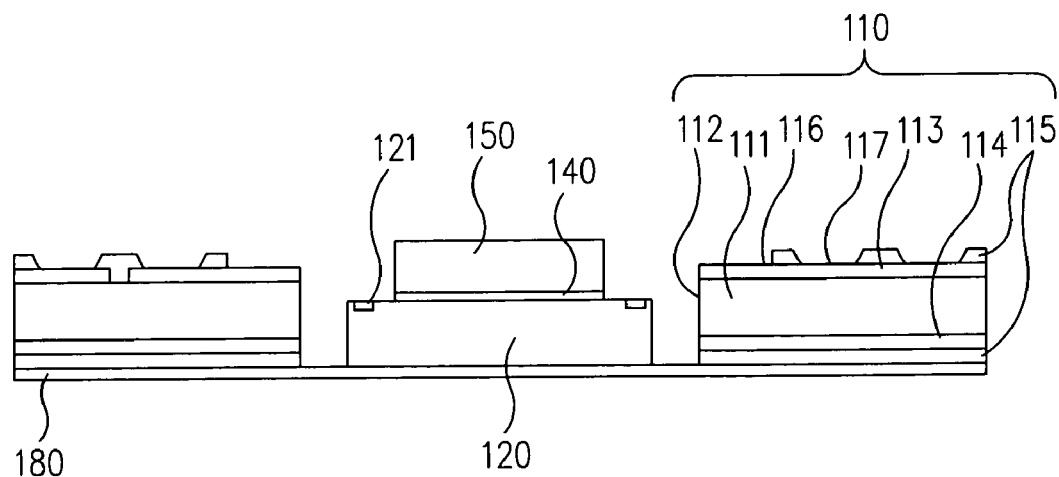

As shown in FIG. 5E, the reinforcement 150 is adhered to the upper surface of the reinforcement adhesive layer 140, thereby coupling the reinforcement 150 to the active surface of the semiconductor die 120. The reinforcement adhesive layer 140 typically should have sufficient adhesiveness prevent the reinforcement 150 from sliding during the wire bonding and encapsulation steps that, in this embodiment, follow.

As shown, the reinforcement 150 has a large enough volume to minimize the volume of encapsulant 160 used to fill through hole 112. Thus, the X-Y area and the vertical thickness of the reinforcement 150 is optimally selected in consideration of, for instance, the thickness of the semiconductor die 120, the number of semiconductor dies within through hole 112, the height of the bonding wires 130, the height of the solder balls 170, and a process margin thickness for molding the encapsulant 160.

Figure 5F:
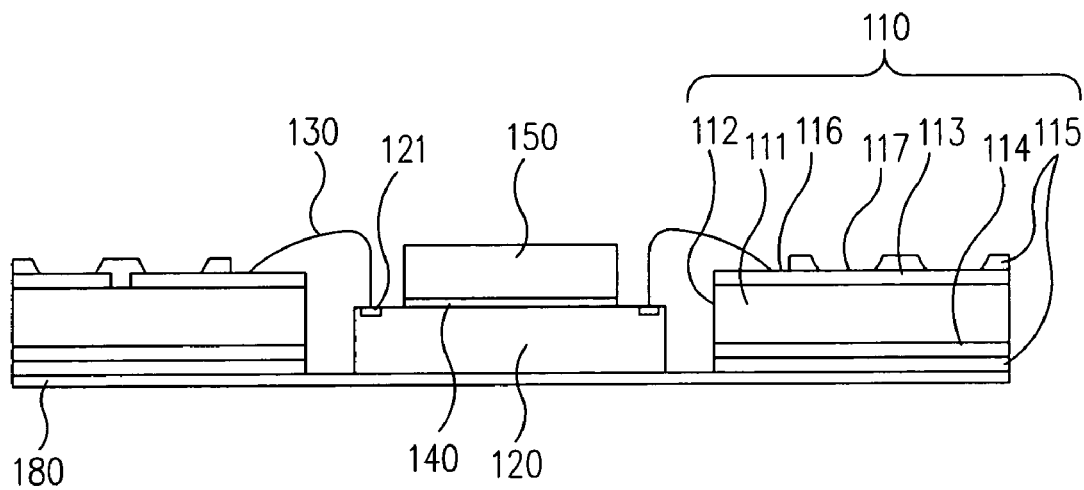

As shown in FIG. 5F, the attachment of reinforcement 150 is followed by a step of electrically coupling the bond wires 130 between the bond pads 121 of the semiconductor die 120 and bond fingers 116 of the circuit patterns 113 of the substrate 110.

Figure 5G:
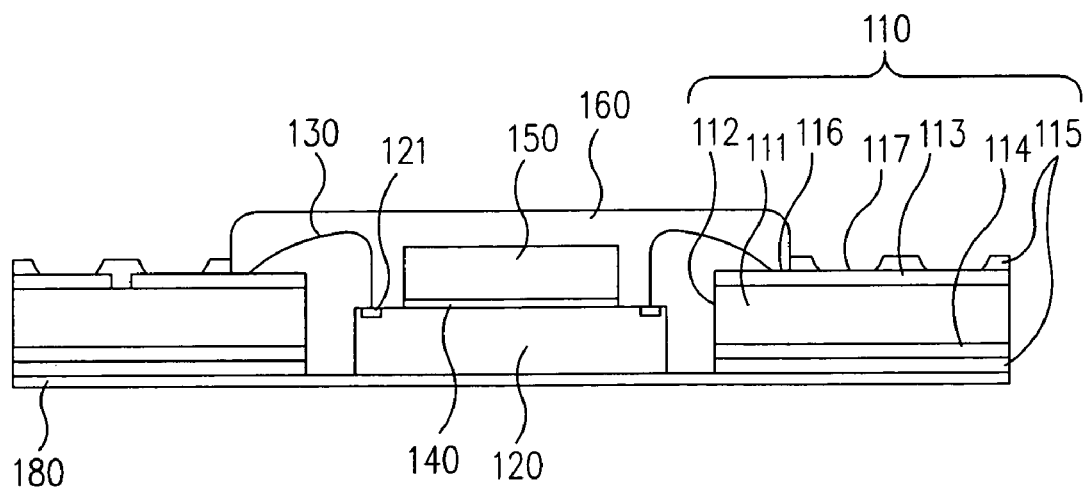

As shown in FIG. 5G, an encapsulant 160 is provided in through hole 112 and applied onto the coverlay tape 180 around semiconductor die 112 and over the semiconductor die 120, the conductive wires 130, the reinforcement adhesive layer 140 and the reinforcement 150. The encapsulant 160 is formed to have a margin of about 4 mil or more from the active surface of semiconductor die 120 to a top of the cap of encapsulant 160. An encapsulating material making up the encapsulant 160 may be EMC or its equivalent.

In one method of encapsulation, the substrate 110, with the semiconductor die 120, conductive wires, 130, the reinforcement adhesive layer 140 and the reinforcement 150 are placed in a mold cavity having either a center gate over the reinforcement 150 or a corner gate. Molten EMC is introduced into the mold cavity through the corner or center gate, fills the through hole 112, and covers the semiconductor die 120, conductive wires, 130, the reinforcement adhesive layer 140 and the reinforcement 150. Subsequently, the EMC is hardened, thereby forming the hardened encapsulant 160 shown in FIG. 5G.

As the thickness of reinforcement 150 increases, it becomes desirable to make use of a corner gate, rather that a center gate, for introducing a molten encapsulant 160 into a mold cavity used for the encapsulation process. Use of a corner gate may improve a flow of the molten encapsulant 160, and thus may reduce the possibility of incomplete molding where relatively larger reinforcements 150 are used.

Figure 5H:
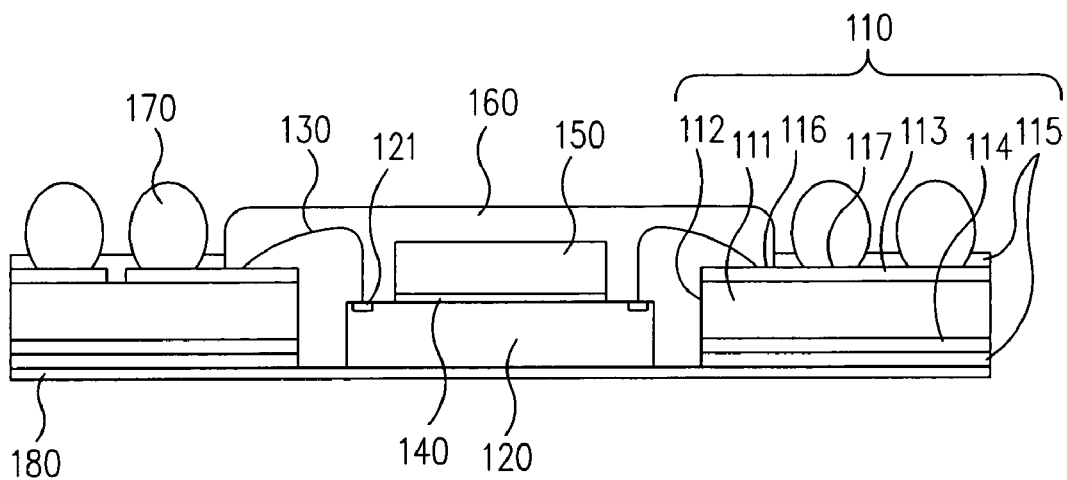

As shown in FIG. 5H, the solder balls 170 are then fused to the ball lands 117 of the circuit patterns 113. Typically, the solder balls 170 are temporarily adhered to the ball lands 117 of the circuit patterns 113 by a sticky substance, such as a flux, and then are firmly fused onto the ball lands 117 by a high-temperature reflow process.

Figure 5I:
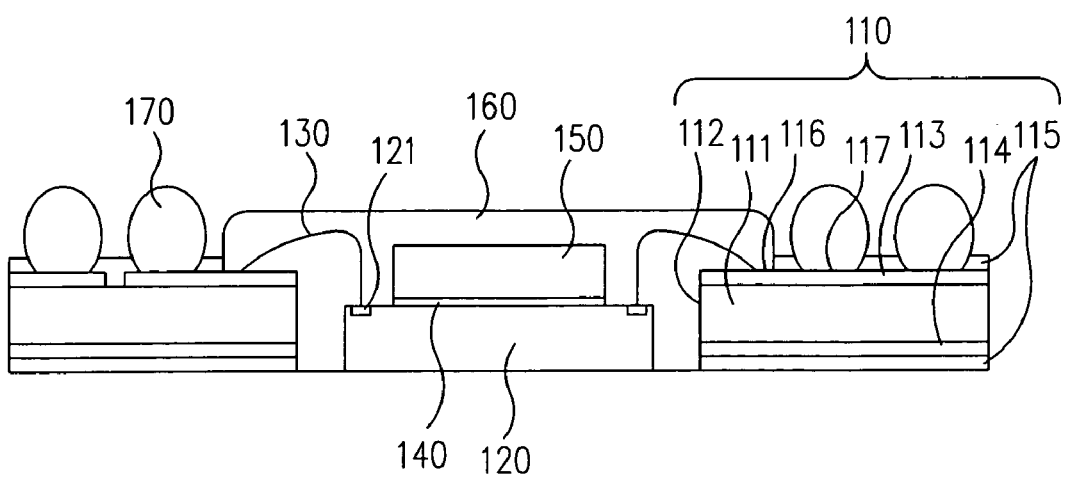

Finally, in FIG. 5I, an optional step of removing coverlay tape 180 is shown. The coverlay tape is not needed to secure the semiconductor die 120 after the encapsulant 160 is hardened. Removal of the coverlay tape 180 exposes the inactive surface of the semiconductor die 120.

A method for manufacturing the semiconductor package 200 is the same as that shown for manufacturing semiconductor package 100, except that plural reinforcements 250 are used. Use of the plural reinforcements 250, with a constant lateral spacing between them, facilitates use of a center gate molding method. The center gate of the mold cavity is centered over the gap between the plural reinforcements 250.

FIGS. 6A to 6G illustrate an exemplary method of making the substrate 310 of semiconductor package 300 of FIG. 3, and the step of attaching solder balls 371, 372 to the substrate. Other exemplary steps for making semiconductor package 300 are the same as those shown in FIGS. 5A–5C, 5F, and 5G.

Figure 6A:
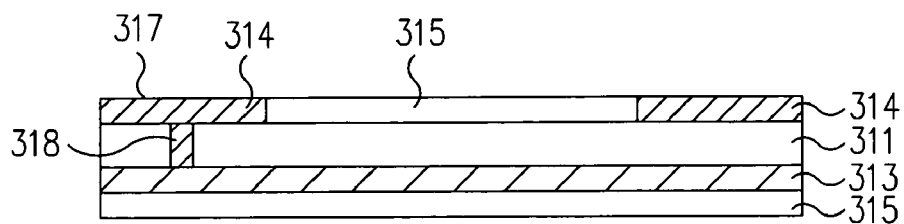
FIGS. 6A to 6G are side sectional views illustrating procedures of a method for manufacturing the semiconductor package of FIG. 3.

Initially, a substrate 310 is provided. FIG. 6A illustrates a portion of the substrate 310, which includes upper circuit patterns 314 and lower circuit patterns 313 on the opposed upper and lower surfaces of resin layer 311, respectively. A patterned protective layer 115 overlies the upper surface of resin layer 311, excluding portions of upper circuit patterns 314. A temporary protective layer 315 overlies the lower surface of resin layer 311, including the circuit patterns 313.

Figure 6B:
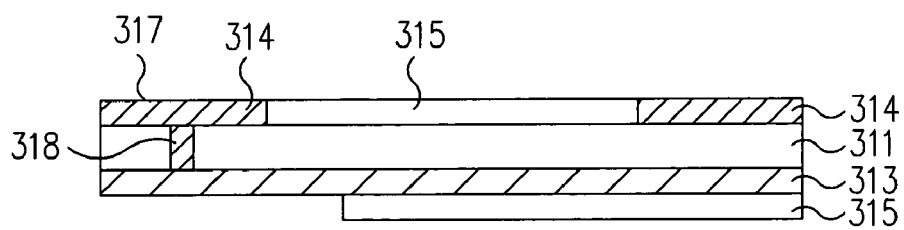

As shown in FIG. 6B, the temporary protective layer 315 on the lower surface of the resin layer 311 is developed and partially removed, so that some of the circuit patterns 313 have a subpart (including the ball land 317) exposed through the protective layer 315. In particular, the circuit patterns 313 that are partially exposed include those that will support a solder ball 372 on their exposed ball land 317. Meanwhile, other subparts of the partially-exposed circuit patterns 313, and all portions or subportions of the remaining circuit patterns 313 remain covered by the lower protective layer 315.

Figure 6C:
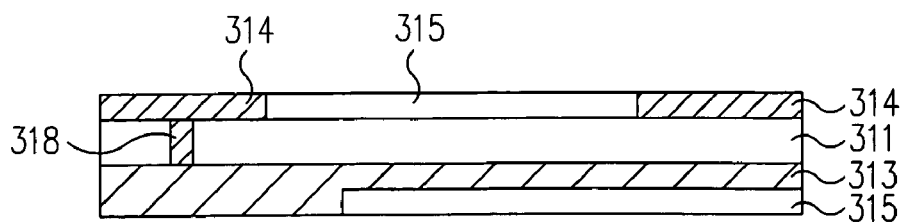

As shown in FIG. 6C, the exposed subportions of the partially exposed circuit patterns 313 are subjected to a plating step using the temporary protective layer 315 as a mask. The plating step applies an additional metal layer or layers onto the exposed subportion (including the ball land 317) of the partially exposed circuit patterns 313, thereby increasing the thickness of the exposed subportions of the circuit patterns 313 by tens of micrometers, e.g., 15 to 20 $\mu$m. Relatively-greater thicknesses of the plating metal may be achieved by repeating the plating step. The plated-on metal may be the same metal used to form the underlying portion of the circuit patterns 313. Meanwhile, the temporary protective layer 315 prevents other portions of the partially exposed circuit patterns 313, as well as the non-exposed non-stepped circuit patterns 313, from being plated. The plating increases the thickness of the exposed subportion of the partially exposed circuit patterns 313.

In an alternative embodiment, where different heights of the plating metal are provided on different circuit patterns 313, e.g., where there are more than two rows of solder balls, as discussed above, then additional temporary protective layers 315 may be applied, patterned, and used as masks for additional plating steps, thereby ensuring that selected subportions (including the ball lands 317) of selected circuit patterns 313 receive an appropriately-thick layer of the plating metal.

Figure 6D:
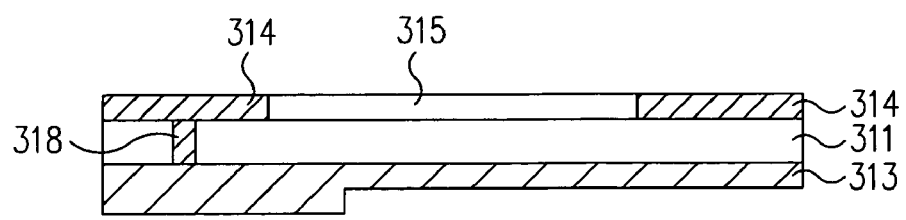

As shown in FIG. 6D, the temporary protective layer 315 is then totally removed, thereby fully exposing all of the lower circuit patterns 313.

Figure 6E:
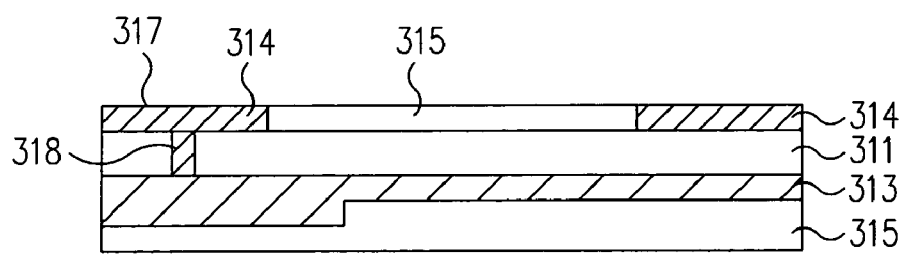

As shown in FIG. 6E, another protective layer 315 is applied over the lower surface of the resin layer 311, covering all portions of the circuit patterns 313.

Figure 6F:
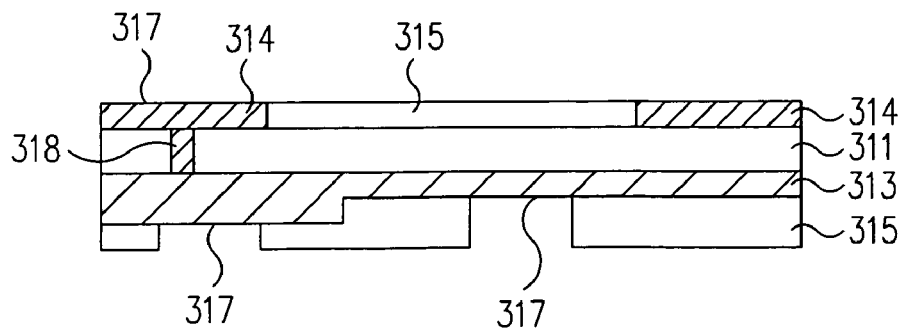

As shown in FIG. 6F, the protective layer 315 is developed and partially removed, so that selected portions of the stepped and non-stepped circuit patterns 313, including the ball lands 317, are exposed. If desired, a thin layer of gold, silver, nickel, or the like may be plated onto the top surface of the stepped and non-stepped ball lands to facilitate attachment of the solder balls 371, 372 thereto.

Figure 6G:
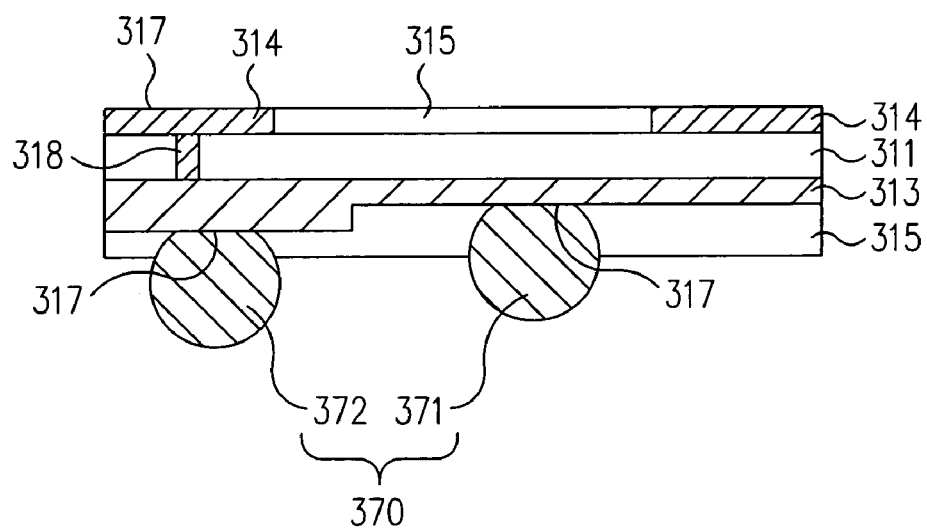

As shown in FIG. 6G, the solder balls 371, 372 are then fused to the ball lands 317 through the apertures of the protective layer 315. The solder balls 371, 372 may be temporarily arranged with use of a sticky substance, such as a flux, and then firmly fused to the ball lands 317 by a high-temperature reflow process.

Note that, since the solder balls 371, 372 are the same size, the outer row solder balls 372 will protrude further from the surface of resin layer 311 of substrate 310 than the inner row solder balls 371 because the ball lands 317 underlying the outer solder balls 372 are thicker relative to the lower surface of resin layer 311 than the ball lands 317 underlying the inner solder balls 371 by tens of micrometers.

FIGS. 7A to 7G illustrate an alternative to the process of FIGS. 6A–6G for making the relevant portions of semiconductor package 300. Other exemplary steps for making semiconductor package 300 are the same as those shown in FIGS. 5A–5C, 5F, and 5G.

Figure 7A:
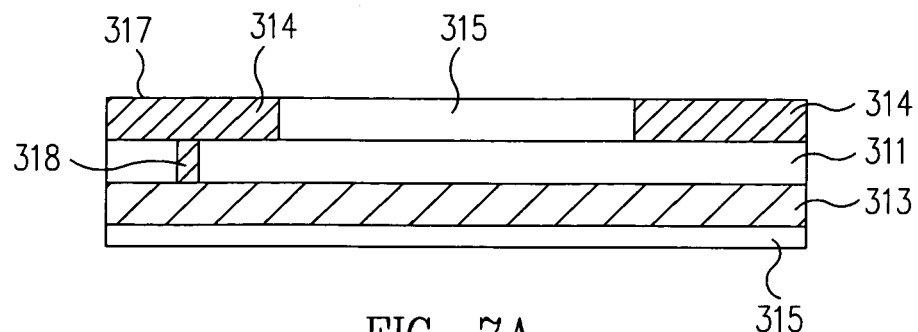
FIGS. 7A to 7G are side sectional views illustrating procedures of an alternative method for manufacturing the semiconductor package of FIG. 3.

Initially, a substrate 310 is provided. FIG. 7A illustrates a portion of the substrate 310, which includes upper circuit patterns 314 and lower circuit patterns 313 on the opposed upper and lower surfaces of resin layer 311. A patterned protective layer 315 overlies the upper surface of resin layer 311, excluding portions of upper circuit patterns 314. A temporary protective layer 315 overlies the lower surface of resin layer 311, including circuit patterns 313.

Figure 7B:
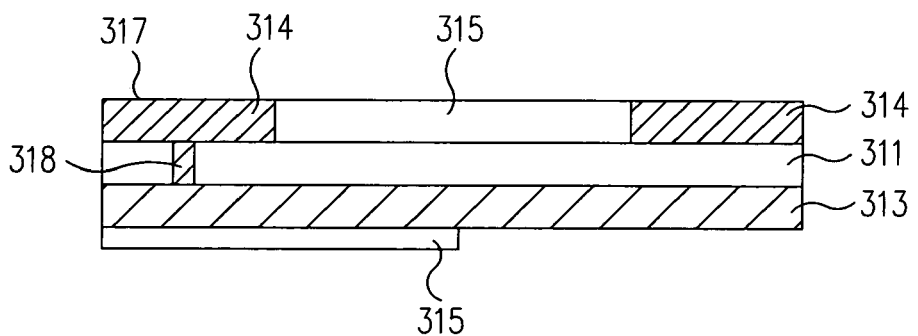

As shown in FIG. 7B, the temporary protective layer 315 on the lower surface of the resin layer 311 is developed and partially removed, so that some of the circuit patterns 313 have a subportion, including their respective ball lands 317, exposed through the protective layer 315. Meanwhile, other subparts of the partially exposed circuit patterns 313, and all portions or subportions of the remaining circuit patterns 313 remain covered by the lower protective layer 315. In particular, the ball lands 317 that are exposed include those that will support a solder ball 371 on their ball land 317.

Figure 7C:
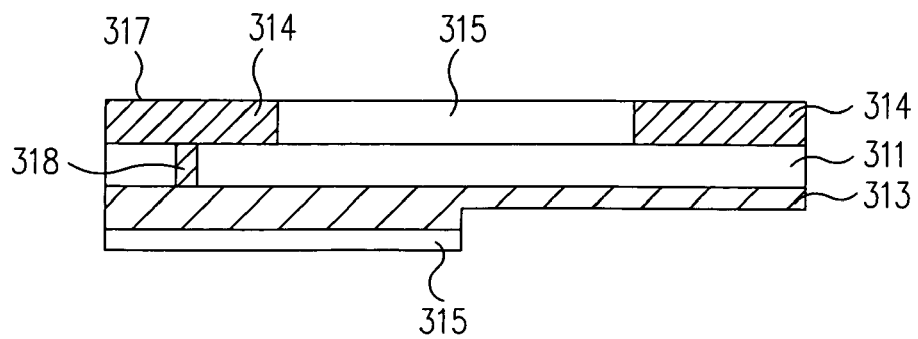

As shown in FIG. 7C, the exposed subportions of the partially exposed circuit patterns 313 are subjected to an etching process, using the patterned temporary protective layer 315 as a mask. In particular, the ball lands 317 of the respective circuit patterns 313 that will support an inner solder ball 371 are etched partially (e.g., halfway) through their thickness. A wet or dry etching process may be used. The amount etching may be, for example, about 15 to 20 $\mu$m. Since the ball lands 317 of the circuit patterns that will support an outer solder ball 372 are not etched, the desired stepping of the circuit patterns 313 is accomplished.

Figure 7D:
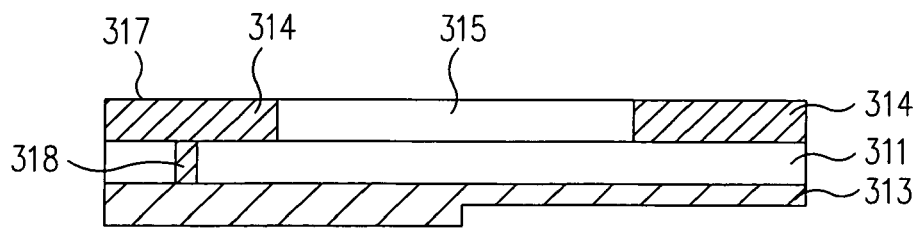

As shown in FIG. 7D, the temporary protective layer 315 is then totally removed, thereby fully exposing all of the lower circuit patterns 313.

Figure 7E:
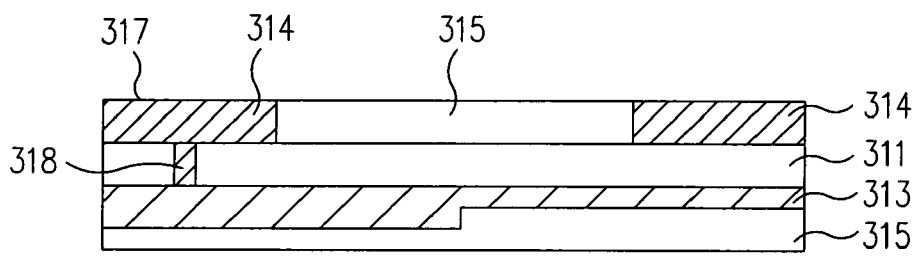
Figure 7F:
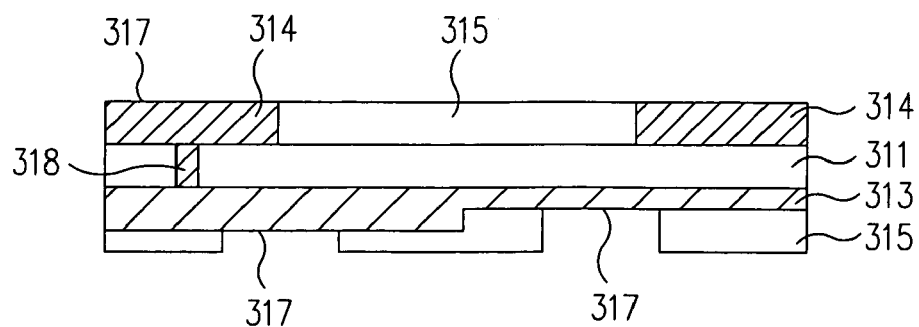
Figure 7G:
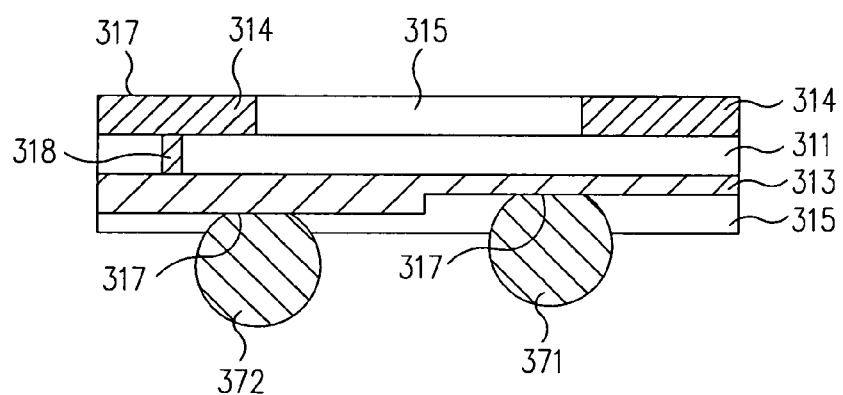

FIGS. 7E to 7G show steps identical to those of FIGS. 6E to 6G, and hence do not need further discussion.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a substrate including a core insulative layer with a central through hole, and a plurality of circuit patterns on a first surface of the core insulative layer, with each of the plurality of circuit patterns of the first surface including a ball land;
   wherein a first subset of ball lands protrude further from the first surface than a second subset of the ball lands;
   a plurality of same size solder balls, wherein a respective one of the solder balls is fused to each of the respective ball lands of the first and second subsets of the ball lands, whereby the solder balls fused to the ball lands of the first subset protrude further from the first surface than the solder balls fused to the ball lands of the second subset;
   a semiconductor die disposed in the through hole and electrically coupled to the circuit patterns; and
   a hardened encapsulant in the through hole covering the semiconductor die.

2. The semiconductor package of claim 1, wherein the core insulative layer includes a second surface opposite the first surface, said second surface being covered by a blanket conductive layer.

3. The semiconductor package of claim 1, wherein the core insulative layer includes a second surface opposite the first surface, said second surface being covered by a plurality of circuit patterns, with at least some of the circuit patterns of the second surface being electrically coupled through the core insulative layer to some of the circuit patterns of the first surface.

4. The semiconductor package of claim 3, wherein at least some of the circuit patterns of the second surface include a ball land.

5. The semiconductor package of claim 4, wherein a second semiconductor package is stacked thereon, said second semiconductor package including solder balls fused to the ball lands of the circuit patterns of the second surface.

6. The semiconductor package of claim 1, wherein the semiconductor die includes an active surface having a plurality of bond pads disposed near a perimeter of the active surface, and further comprising a monolithic slug affixed to the active surface of the semiconductor die within and without covering any of the bond pads, said slug being formed of a semiconductor material but not including any integrated circuits, and being fully covered by the encapsulant.

7. The semiconductor package of claim 6, wherein there are at least two of said slugs affixed to the active surface of the semiconductor die within and without covering any of the bond pads, said at least two slugs being fully covered by the encapsulant and spaced apart from each other.

8. The semiconductor package of claim 1, wherein the semiconductor die includes an active surface having a plurality of bond pads disposed near a perimeter of the active surface, and further comprising a monolithic slug affixed to the active surface of the semiconductor die within and without covering any of the bond pads, said slug being formed of metal and being fully covered by the encapsulant.

9. The semiconductor package of claim 8, wherein there are at least two said slugs affixed to the active surface of the semiconductor die within and without covering any of the bond pads, said at least two said slugs being fully covered by the encapsulant and being spaced apart from each other.

10. An electrical substrate comprising:
    a core insulative layer having a first surface;
    a layer of circuit patterns on the first surface, said circuit patterns each including one of a plurality of ball lands;
    a plurality of same-size solder balls disposed in a plurality of rows, including a first row and a second row, said first row being closer to a perimeter of the core insulative layer than the second row, each said solder ball being fused to a respective one of the ball lands,
    wherein the solder balls of the first row extend further from the first surface than the solder balls of the second row.

11. The electrical substrate of claim 10, wherein the core insulative layer includes a through hole between the first surface and an opposite second surface, and an encapsulated semiconductor die is disposed in the through hole.

12. The electrical substrate of claim 10, wherein a third row of the solder balls is disposed between the first row and the second row, and the solder balls of the third row extend further from the first surface than the solder balls of the second row.

13. The electrical substrate of claim 12, wherein the solder balls of the first row extend further from the first surface than the solder balls of the third row.

14. The electrical substrate of claim 10, wherein a third row of the solder balls is disposed between the first row and the second row, and the solder balls of the first row extend further from the first surface than the solder balls of the second and third rows.

15. The electrical substrate of claim 10, wherein the core insulative layer includes a second surface opposite the first surface, the second surface includes a plurality of circuit patterns, at least some of the circuit patterns of the second surface are electrically coupled through the substrate to some of the circuit patterns of the first surface, and some of the circuit patterns of the second surface include a ball land.

16. The electrical substrate of claim 10, wherein a semiconductor die is electrically coupled to at least some of the circuit patterns.

17. An electrical substrate comprising:
    a core insulative layer having a first surface;
    a layer of circuit patterns on the first surface, said circuit patterns each including one of a plurality of ball lands,
    wherein a first subset of the circuit patterns include a stepped subportion including the ball land of the respective circuit pattern, and a second subset of the circuit patterns do not include a stepped portion, said stepped portion having a thickness from the first surface greater than a thickness of a remaining subportion of the respective circuit pattern.

18. The electrical substrate of claim 17, further comprising a plurality of solder balls, wherein a respective one of the solder balls is fused to the ball land of the circuit patterns of the first and second subsets.

19. The electrical substrate of claim 17, wherein the core insulative layer has a through hole extending between the first surface and an opposite second surface, and a semiconductor die and an encapsulant over the semiconductor die are disposed in the through hole.

20. The electrical substrate of claim 17, wherein a third subset of the circuit patterns also include a stepped subportion including the ball land of the respective circuit pattern, with the stepped subportion of the third set of circuit patterns having a thickness from the first surface of the substrate lesser than the thickness of the stepped subportion of the first subset of the circuit patterns.

* * * * *